United States Patent [19]

Naka et al.

[11] 4,053,317
[45] Oct. 11, 1977

[54] LIGHT-SENSITIVE COMPOSITION

[75] Inventors: Kiyomi Naka; Michisuke Oe, both of Hino, Japan

[73] Assignee: Teijin Limited, Osaka, Japan

[21] Appl. No.: 649,965

[22] Filed: Jan. 19, 1976

Related U.S. Application Data

[63] Continuation of Ser. No. 494,187, Aug. 2, 1974, abandoned.

[30] Foreign Application Priority Data

Aug. 7, 1973   Japan .................................. 48-87983

[51] Int. Cl.$^2$ .......................... G03C 1/68; C25C 1/14
[52] U.S. Cl. .................................. 96/115 P; 96/35.1;
96/115 R; 204/159.18; 204/159.23; 204/159.24
[58] Field of Search ............... 96/115 P, 35.1, 115 R; 204/159.18, 159.23, 159.24

[56] References Cited

U.S. PATENT DOCUMENTS

| 3,074,869 | 1/1963 | Workman ......................... 96/115 R |
| 3,615,629 | 10/1971 | Wilhelm et al. ................... 96/115 P |

Primary Examiner—Jack P. Brammer
Attorney, Agent, or Firm—Sherman & Shalloway

[57] ABSTRACT

A light-sensitive composition comprising of
1. an N-nitroso compound having the general formula

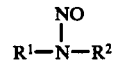

wherein $R^1$ and $R^2$, which may be the same or different, are each a member selected from the group consisting of a monovalent hydrocarbon radical, a monovalent hydrocarbon radical attached to the nitrogen atom of amine through —SO$_2$—, and a group of the formula

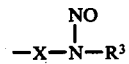

where X is a divalent hydrocarbon radical, and $R^3$ is a monovalent hydrocarbon radical, which may be the same as $R^1$ or different therefrom, which $R^1$, $R^2$ and $R^3$ may have substituent groups, and $R^1$ and $R^2$ may together form, directly or by being bonded through an oxygen atom or nitrogen atom, a ring;
2. a photopolymerization initiator; and
3. a compound having a photopolymerizable ethylenic double bond in its molecule.

10 Claims, No Drawings

LIGHT-SENSITIVE COMPOSITION

This is a continuation, of Application Ser. No. 494,187, filed Aug. 2, 1974, now abandoned.

This invention relates to a light-sensitive composition that can be hardened by light.

More particularly, the present invention relates to a light-sensitive composition containing a photopolymerizable component, which composition is suitable for direct use as printing plates.

The process of preparing relief images using a composition containing a photopolymerizable componnent and consisting of photohardening those portions corresponding to the transparent portions of a negative or positive film having transparent images followed by removing those portions corresponding to the opaque portions of the film with an aqueous or organic solvent, and the compositions that can be used for such purposes, have been known.

However, in the relief images obtained from the conventional light-sensitive compositions the images of the negative or positive film with respect to their outlines were not necessarily reproduced with faithfulness, there being noted frequently the so-called "filling up" phenomenon, i.e., the occurrence in parts of unnecessary hardening in nonimage areas, areas that should have properly been removed. In consequence, the depth of the nonimage portions become shallow causing clogging of ink in the printing process.

This hardening of the nonimage area is believed to be caused principally by the setting up of heat-polymerization in the nonimage area by the heat of polymerization that is generated by the photopolymerization reaction of the portion corresponding to the relief and the setting up of polymerization in the nonimage area by the weak scattering rays. For checking such unnecessary polymerization, various polymerization inhibitors and polymerization suppressing agents have been studied and suggested. However, while some of these inhibitors or suppressing agents check the unnecessary heat-polymerization of the nonimage area, in most cases they also impede the polymerization of those portions that should be photopolymerized. On the other hand, some had such drawbacks as causing discoloration to impair the light transmittance of the photohardenable composition, with the consequence that the photopolymerization sensitivity of the composition undergoes deterioration. Heedless to say, when the addition of the inhibitor or suppressing agents is a small amount such as does not impair the photopolymerization of the image areas, such effects as the inhibition of the hardening of the nonimage areas and storage stability would be small, and hence it would not be practical.

The object of the present invention resides in overcoming such deficiencies of the conventional methods and providing a light-sensitive composition which not only can form a clear-cut relief by faithfully reproducing the original image but also possesses sufficient storage stability.

In consequence of our assiduous research with a view to achieving the foregoing object, we found that certain specified N-nitrosoamine compounds had excellent polymerization inhibiting actions on the light-sensitive compositions consisting of an ethylenically unsaturated compound containing a photopolymerization initiator. Thus, the present invention was developed.

Accordingly, the foregoing object of the present invention is achieved by a light-sensitive composition consisting essentially of 1. an N-nitroso compound having the general formula

wherein $R^1$ and $R^2$, which may be the same or different, are each either a monovalent hydrocarbon radical, a monovalent hydrocarbon radical attached to the nitrogen atm of amine through -$SO_2$-, or a group of the formula

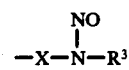

where X is a divalent hydrocarbon radical, and $R^3$ is a monovalent hydrocarbon radical, which may the same as $R^1$ or different therefrom, which $R^1$, $R^2$ and $R^3$ may have substituent groups, and $R^1$ and $R^2$ may together form, directly or by being bonded through an oxygen atom or nitrogen atom a ring;

2. a photopolymerization initiator; and
3. a compound having a photopolymerizable ethylene double bond in its molecule.

The light-sensitive composition of this invention, as hereinabove indicated, contains as its primary component a compound having the formua (a). This compound of formula (a) has practically no impeding efects on the photopolymerization reaction of the relief portions that are initiated by the photopolymerization initiator. It moreover completely checks the progress of unnecessary polymerization of the nonrelief portions and in addition, and confer on the composition at the same time a very excellent storage stability.

As the foregoing compounds of formula (a), there can be named, for example, the various substances such as are enumerated below. That is, included are dialkyl or alkylalkenyl nitrosoamines such as dimethylnitrosoamine, diethylnitrosoamine, diisopropylnitrosoamine, di-n-butylnitrosoamine, di-t-butylnitrosoamine, N-methyl-N-ethylnitrosoamine, N-methyl-N-isopropylnitrosoamine, N-methyl-N-n-butylnitrosoamine, N-methyl-N-t-butylnitrosoamine, N-ethyl-N-isopropylnitrosoamine, N-ethyl-N-n-butylnitrosoamine, N-ethyl-N-t-butylnitrosoamine, N-isopropyl-N-n-butylnitrosoamine, N-isopropyl-N-t-butylnitrosoamine, N-methyl-N-vinylnitrosoamine, N-ethyl-N-vinylnitrosoamine, N-isopropyl-N-vinylnitrosoamine, N-to-butyl-N-vinylnitrosoamine, N-n-butyl-N-vinylnitrosoamine, N-methyl-N-allylnitrosoamine, N-ethyl-N-allylnitrosoamine, N-isopropyl-N-allylnitrosoamine, N-n-butyl-N-allylnitrosoamine and N-t-butyl-N-allylnitrosoamine.

Also included are the alkyl, aralkyl or diaralkylnitrosoamines such as N-methyl-N-benzylnitrosoamine, N-ethyl-N-benzylnitrosoamine, N-isobutyl-N-benzylnitrosoamine, N-n-butyl-N-benzylnitrosoamine, N-t-butyl-N-benzylnitrosoamine and dibenzylnitrosoamine, as well as the N-nitroso compounds of aromatic amines such, for example, as N-ethyl-N-phenylnitrosoamine, N-isopropyl-N-phenylnitrosoamine, N-n-butyl-N-phenylnitrosoamine, N-t-butyl-N-phenylnitrosoamine, diphenylnitrosoamine, N,N'-dimethyldinitroso-p-phenylenediamine, N,N'-diethyldinitroso-p-phenylenediamine and N,N'-diphenyldinitroso-p- phenylenediamine. Also usable in this invention are the N,N'-dialkyldinitroso-alkylenediamines, N-alkyl-N'-phenyldinitrosoalkylenediamines, or N-alkyl-N'-aralkyldinitrosoalkylenediamines such as N,N'-dimethyldinitrosoethylenediamine, N,N'-diethylnitrosoethylenediamine, N-methyl-N'-phenylnitrosoethylenediamine, N,N'-dimenthyl-dinitrospropylenediamine and N-methyl-N'-benzylnitrosopropylenediamine. In addition, usable are also such compounds as 1-nitrosopiperidine, 1,4-dinitrosopiperazine and 4-nitrosomorpholine, as well as the triaminotrinitroso compounds such as (4,4'-N-nitroso-N-methylamino) N-nitrosodiphenylamine.

The light-sensitive composition of this invention can contain in an amount of 0.001 to 5 parts by weight, and preferably 0.003 to 0.5 part by weight, per 100 parts by weight thereof of one or more classes of the N-nitroso compounds of formula (a), such as illustrated above. However, the foregoing range as to the amount used is not critical and can be varied suitably in accordance with the properties of the resin and its intended use.

The component (3) one of the other principal components making up the light-sensitive composition of the present invention is either liquid or solid at room temperature and normal atmospheric pressure and is an unsaturated compound containing one or more ethylenically unsaturated bonds which can be split and polymerized by the action of light. These unsaturated compounds are usually used with a suitable high molecular weight binder which is compatible with said unsaturated compound. For instance, when the ethylenically unsaturated compound is a liquid monomer of relatively low molecular weight, it is used admixed with one of the various high molecular weight binders. In this case, depending upon the amount of binder used, the composition as a whole can be made to exhibit either a liquid or solid state. In this invention, the various advantages hereinbefore described can be expeceted regardless of whether the light-sensitive composition is liquid or solid. Further, of the high molecular weight binders, still more preferably used are those having a functional group which can react with the active group of the ethylenically unsaturated compound when exposed to light, such, for example, as a carbon-to-carbon double bond.

As the foregoing unsaturated compounds to be used as component (3), there can be mentioned, for example, acrylic acids or derivatives thereof such as acrylic acid, methacrylic acid, alpha-ethylacrylic acid or alpha-chloroacrylic acid, nonesters of acrylic acid such as methyl acrylate, ethyl acrylate, lauryl acrylate and phenyl acrylate, diesters of acrylic acid such as ethylene glycol diacrylate, polyethylene glycol diacrylate, propylene glycol diacrylate and polypropylene glyxol diacrylate, polyacrylates of acrylic acid such as glycerol triacrylate and trimethylolpropane triacrylate, monoesters of methacrylic acid such as methyl methacrylate, ethyl methacrylate and lauryl methacrylate, diesters of methacrylic acid such as ethylene glycol dimethacrylate, polyethylene glycol dimethacrylate, propylene glycol dimethacrylate and polypropylene glycol di-methacrylate, polyesters of methacrylic acid such as glycerol trimethacrylate and trimethylolpropane trimethacrylate, acrylamide and derivatives thereof such as acrylamide, methacrylamide, alpha-ethylacrylamide, alpha-chloroacrylamide, diacetoneacrylamide, N-methoxymethylacrylamide, N-butoxymethylacrylamide, N,N'-methylenebisacrylamide and N,N'-hexamethylenebisacrylamide, vinyl esters such as vinyl acetate and vinyl benzoate, styrene and derivatives thereof such as styrene, vinyltoluene, vinylphenol, vinylbenzoic acid, aminostyrene, chlorostyrene and divinylbenzene, allyl esters such as allyl acetate and diallyl phthalate, and allyl carbonates. These unsaturated compounds can be used either singly or as mixtures of two or more thereof.

As the high molecular weight binder, it is necessary, as indicated hereinbefore, to choose one which is compatible with the unsaturated compound. The polyamide resins, polyester resins, unsaturated polyester resins, polyurethane resins, polycarbonate resins, epoxy resins, polymethyl methacrylate resins, cellulose acetate, cellulose nitrate, methylcellulose, polystyrene, polyvinyl chloride, polyvinyl acetate, polyvinyl alcohol and the derivatives and copolymers thereof can be used in accordance with the class of the unsaturated compound. The foregoing high molecular weight binders can be used in an amount of not more than 10-fold, and preferably not more than 5-fold, that of component (3) the unsaturated compound.

The component (3) unsaturated compound, one of the components making up the invention composition, can be a substance which is liquid at room temperature as well as one which is solid at room temperature. The various high molecular weight compounds mentioned hereinbefore as being used as high molecular weight binders can also be used with satisfaction, if a group reactive with the component (3), e.g., a carbon-to-carbon double bond, is introduced into their side chain. Further, the invention light-senstive composition can be incorporated with fillers for improving its strength after its photohardening or with a plasticizer for enhancing its flexibility.

The aforesaid compound of formula (a) used in the present invention has an action that is conducive to the storage stability of the light-sensitive composition and thus a further addition of a conventional polymerization inhibitor is not necessarily required, but for a further enhancement of its storage stability, the concurrent addition of a conventional polymerization inhibitor may be made.

As this polymerization inhibitor, such compounds as hydroquinone, p-methoxyphenol, catochol and picric acid can be used in a proportion of 0.01 – 1.0 part per 100 parts of the unsaturated compound.

The light-sensitive composition of the invention contains as component (2) a photopolymerization initiator. Such photopolymerization initiators include, e.g., benzoin and derivatives thereof sycg as benzoin, benzein methyl ether, benzoin ethyl ether, benzoin isopropyl ether, benzoin isobutyl ether, alpha-methylbenzoin, alpha-allybenzoin and alpha-phenylbenzoin, disulfides such as diphenyldisulfide, anthraquinone and derivatives thereof such as anthraquinone, chloroanthraquinone, methylanthroquinone and 2-t-butylanthraquinone and pigments such as 2-napthalenesulfonyl chloride, Erosine, Fluoresceine and Indanthrene. These photopolymerization initiators are usually used in a proportion of 0.001 – 100 parts by weight per 100 parts by weight of the aforementioned unsaturated compound.

The light-sensitive composition of this invention is obtained by thoroughly mixing the aforementioned several components.

In preparing an printing plate using the light-sensitive composition of the present invention, it is convenient to use as the support; a metal plate of, for example, iron stainless steel, zinc or aluminum; or a rubber sheet of either natural rubber or synthetic rubber; or a polymeric film such as of celluloid, polyetylene, polypropyine, polyvinyl chloride, polyethylene terephthalate a polyamides; on which support is formed a layer of the light-sensitive composition to a thickness of from 0.1 to several millimeters. When the composition is a solid, it is dissolved in a solvent, after which the resulting solution is either cast or coated to the top of a support, say, a metal plate of such as aluminum or iron or a plastic film or sheet of such as polyethylene terephthalate to provide an element having light sensitivity. Alternately, there is a method in which the composition, while being formed into sheet form by means of rolls or a press, is laminated to the support. On the ether hand, when the composition is a liquid, it used as such, it being cast or coated to the support at the place where it is to be used. It necessary, the layer of the light-sensitive composition can be adhered to the support by means of an adhesive layer.

When the aforesaid light-sensitive composition is used for relief formation, it is exposed to actinic rays through either a negative or positive film having a pattern.

The light source used for emitting actinic rays can be suitably chosen from such light sources as a tungsten lamp, fluorescent lamp, carbon arc lamp, mercury lamp or xenon arc lamp in accordance with the character of the light-sensitive composition, but usually preferred is one which gives off actinic radiation abounding in ultraviolet rays. The light-sensitive composition that has been exposed to actinic rays is then developed in a dilute aqueous alkaline solution, e.g., an aqueous sodium carbonate solution or an aqueous caustic soda solution; water; or an organic solvent, after which the unhardened portion is removed and the hardened portion in dried to obtain a clear-cut relief.

In one instance of the light-sensitive composition of the present invention, it was found that even though the time the light-sensitive compositions was exposed to actinic radiation through a negative or positive film was in excess of up to about threefold that for completing substantially the hardening of the corresponding image area, unnecessary polymerization and hardeing of the nonimage area hardly occurred, and a clear-cut relief image was obtained.

Heretofore, when hold and fine pattens, e.g., held characters and fine characters, were present together in a single composite pattern, the establishment of the exposure conditions was a difficult matter. A proper exposure time for the bold characters would result in a lack of exposure for the fine characters, whereas a proper exposure time for the fine characters would result in so-called filling up.

In the case of the invention light-sensitive composition, it is possible, as hereinbefore described, to widen to a marked degree the limits of the safety of exposure, with the consequence that the foregoing difficulty experienced heretofore can be resolved. The benzene ring-containing nitroso compounds of the general formula (a) demonstrate these effects best. Of these, the nitreso compounds of the general formula (a) in which both $R^1$ and $R^2$ have benzene rings, especially an aryl group, e.g., N-nitrosodiphenylamine, are extremely effective.

Further, the composition of this invention, in view of its possession of high storage stability, fully retains its light sensitivity and wide exposure limits even after a prolonged storage period.

The following examples will be given for more specifically illustrating the invention. In the examples the parts are on a weight basis.

The data shown in the examples of the depth, spreading of half tone dots and storage stability were determined in the following manner.

1. Measurement of depth.

A printing plate is prepared using a negative film having a nonimage portion of 300-micron width, following which the nonrelief portion (the portion corresponding to the non-image portion of the negative) of the printing plate is measured for its depth. A surface roughness meter SURF COM-30 (manufactured by Tokyo Seimitsu Co., Ltd., Japan) is used for the measurement.

2. Test for determining the spreading of half tone dots

A printing element is prepared by adhering the light-sensitive composition to be tested to a support. A negative film is then placed in contact with the surface of the light-sensitive element and exposed to ultraviolet rays, followed by dissolving and removing the unexposed portion to obtain a printing plate. These portions of half tone dot density of 90% of the negative film and the plate are photographed and enlargements are made on photographic printing papers, following which each are cut out and weighed. The spreading of half tone dots is defined as follows:

$$\text{Spreading of half tone dots} = \frac{\text{Weight of portions cut out of paper printed with half tone dots of plate}}{\text{Weight of portions cut out of paper printed with half tone dots of original negative}}$$

3. Storage stability test

The liquid resin is placed in a glass tube of an inside diameter of 2 centimeters and a height of 20 centimeters to above 7-centimeter up the cube, after which a glass rod 0.5 centimeter in diameter is inserted into the tube. This glass tube is then placed in a constant temperature chamber and heated continuously. The period of time till the glass tube can be raised along with the glass rod because of gelling of the resin when the latter is picked up is measured.

EXAMPLE 1

To 70 parts of an unsaturated polyester resin (acid value about 100) synthesized by the usual polycondensation reaction of diethylene glycol, adipic acid and fumaric acid in the proportion of 9, 3 and 7 mols, respectively, were added 10 parts of acrylamide, 20 parts of acrylic acid, 2 parts of benzoin, 0.01 part of diisopropylnitrosoamine and 0.02 part of p-methoxyphenol and then the ingredients were thoroughlly mixed to prepare a liquid relief-forming light-sensitive compositions. A steel plate having an antihalation layer and an adhesive layer and of a total thickness of 0.3 mm was used as a support, and this was coated with the foregoing composition to a thickness of 0.7 mm.

The surface of the resin layer was overlaid with a 12-micron-thick polyethylene terephthalate film and then a negative film on which were present both 70-micron ruled lines and broad lines, followed by exposure of the assembly with an ultraviolet fluorescent lamp for 15 minutes. After completion of the exposure, unexposed resin was washed away with a dilute aqueoues alkaline solution, and the plate was dried.

The image of the negative film was faithfully reproduced in the so obtained relief plate, there being no filling up of the lines.

The depth of nonimage area in broad line showed 160 microns. Further, the printed matter obtained by relief printing using this plate was exceedingly clear-out.

EXAMPLE 2 and Control 1

To 70 parts of an unsaturated polyester (acid value about 140) obtained from 157 parts of maleic anhydride, 76.8 parts of trimellitic anhydride and 241 parts of dipropylene glycol were admixed 15 parts of ethylenebisallylcarbonate, 15 parts of acrylamide, 0.02 part of methoxyphenol, 1.0 part of benzoin ethyl ether and 0.02 part of N-nitreso-N-methyl-p-toluenesulfonamide to prepare a liquid photopolymerizable composition. The storage stability of this composition at 50° C. was about 20 days. Again, when a relief image was prepared with this composition as in Example 1, the image as well as the printed matter obtained therefrom was exceedingly clear-cut.

As control, a composition was prepared by operating exactly as described above but using 0.02 part of methoxyphenol instead of 0.02 part of N-nitroso-N-methyl-p-toluenesulfonamide. The storage stability of this composition was 10 days.

EXAMPLE 3 and Control 2

A solid light-sensitive composition obtained by admixing 3 parts of anthraquinone and 0.5 part of N-nitroesodiphenylamine with a mixture of 35 parts of teraethylene glycol dimethacrylate and 65 parts of ethyl cellulose was adhered to a thickness of 1.0 mm to a thin sheet aluminum by means of an adhesive layer to prepare a light-senstive element. A photographic negative film of 150 lines was placed in contact with this element and the element was exposed to light from a 1-kw high pressure mercury lamp fitted with a mirror for obtaining a different light for 7 minutes. Thin was followed by washing off the unexposed portions and drying of the element. Exceedingly beautiful printings could be obtained by the use of the so obtained relief plate.

As control, a relief plate was prepared from a light-sensitive element having the same composition as that described above, except that hydroquinone was used instead of N-nitro liphenylanine.

The spreading of half tone dots of the foregoing two classes of relief plates were measured and compared with the results shown in Table 1, below.

Table 1

| Sample | Spreading of half tone dots |
|---|---|
| Relief plate of Example 3 | 1.02 |
| Relief plate of Control 2 | 1.11 |

EXAMPLE 4

405 parts of an unsaturated polyester synthesized from 187 parts of diethylene glycol, 75 parts of trimellitic anhydride, 136 parts of fumaric acid and 57 parts of adipic acid was admixed with 63 parts of polyethylene glycol (molecular weight 200) diacrylate, 189 parts of polyethylene glycol (molecular weight 600) dimethacrylate, 30 parts of vinylbenzoic acid, 13 parts of benzoin isopropyl ether and 0.1 part of N-ethyl-N-t-butylnitrosoamine to prepare a liquid light-sensitive resin. A polyethylene terephthalate film whose surface was treated to impart it adhesiveness with respect to said resin was coated therewith to a thickness of 0.5 mm. A relief plate was made as in Example 1 using a form negative film. The so obtained relief plate was very excellent for use with a form rotary press. There was no filling up of the characters on the plate and up to 100,000 printings could be made.

Example 5 and Control 3

A copolymer of 50 parts of methyl methacrylate, 20 parts of styrene and 30 parts of methyacrylic acid was synthesized in customary manner. This copolymer was dissolved in dimethylformamide, and glycidyl methacrylate was reacted therewith in an equivalent amount based on the carboxyl groups to synthesize a light-sensitive high molecular weight compound containing vinyl groups in its side chain.

Eighty parts of this high molecular weight compound was dissolved and mixed in 2000 parts of dioxane along with 20 parts of triethylene glycol diacrylate, 3 parts of benzoin ethyl ether and 0.08 part of diphenylnitrosoamine to obtain a homogeneous solution. After removing the insolubles from the solution by filtration, it was applied with a roll coater to a ball-burnished 0.3-mm-thick aluminum sheet for offset use to provide thereon a light-sensitive layer having an average thickness of about 1.2 microns.

In customary manner, the so obtained printing plate was exposed to ultraviolet rays under high vacuum in a state wherein a negative for offset use was placed in contact therewith. After removing the unexposed portions with methyl cellosolve, the plate was inked with a commercial inking emulsion.

The photo-sensitive element obtained as hereinabove described was used, and the spreading of half tone dots test was carried cut varying the exposure time. Again, as control, a photo-sensitive element was made as described above but using methoxyphenol instead of diphenylnitrosoamine, after which the spreading half tone dot test was carried cut as hereinbefore described. The results obtained are shown in the following Table 2.

Table 2

| Experiment No. | Run | Exposure time (sec) | Spreading half tone dots |
|---|---|---|---|
| Example 5 | 1 | 15 | 1.01 |
| " | 2 | 30 | 1.02 |
| " | 3 | 60 | 1.03 |
| Control 3 | 4 | 15 | 1.08 |
| " | 5 | 30 | 1.10 |
| " | 6 | 60 | 1.12 |

In the above table, Runs 1 – 3 are instances where the light-sensitive composition of Example 5 was used, whereas Runs 4 – 6 are the instances of Control 3 where methoxyphenol was used instead of diphenylinitrosoamine.

It can be seen from the foregoing table that while greatly spread hardened portions resulting from exposure for a prolonged period can be noted in the case of the controls, those in accordance with the invention demonstrated a satisfactory state of half tone dot reproducibility.

EXAMPLE 6 – 10 and Control 4 – 6

To 65 parts of an unsaturated polyester (acid value 140) obtained by the polycondensation of trimellitic anhydride, fumaric acid, adipic acid and diethylene glycol in the molar ratio of 2, 6, 2 and 9 mols, respectively, were admixed 5 parts of methacrylamide, 15 parts of diallyl phthalate, 15 parts of polyethylene glycol (molecular weight 200) dimethacrylate, 0.6 part of benzoin ethyl ether and the several additives indicated in Table 3 to prepare the several classes of liquid light-sensitive resins.

Further, as controls, the experiment was conducted using only methoxyphenol as the additive (Control (4), using

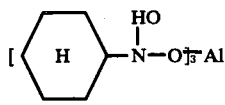

as the additive (control 5) and using methoxyphenol and 2,6-di(t-butyl)-p-nitrosophenol as the additive (Control 6).

The storage stability, exposure time, and degree of filling up of the plates obtained from these several classes of resins were measured. The results obtained are shown in Table 3.

The exposure time shown in the table is the proper exposure time when exposed with a 60-watt ultraviolet fluorescent lamp. This determination was made by noting whether or not there was an adhesion of independent points wtih 200 microns diameter.

together form, directly or by being bonded through an oxygen atom or nitrogen atom, a ring;
  2. a photopolymerization initiator; and
  3. a photopolymerizable compound having a photopolymerizable ethylenic double bond in its molecule.

2. The composition of claim 1 wherein said N-nitroso compound is one having benzene rings in both of its radicals $R^1$ and $R^2$.

3. A printing plate blank comprising the composition of claim 1 and a support.

4. A printing plate blank comprising the composition of claim 1 and a support.

5. The light-sensitive composition of claim 1 wherein said N-nitroso compound is at least one member selected from the group consisting of dimethylnitrosoamine, diethylnitrosoamine, diisopropylnitrosoamine, di-n-butylnitrosoamine, di-t-butylnitrosoamine, N-methyl-N-ethylnitrosoamine, N-methyl-N-isopropylnitrosoamine, N-methyl-N-n-butylnitrosoamine, N-methyl-N-t-butylnitrosoamine, N-ethyl-N-isopropylnitrosoamine, N-ethyl-N-n-butylnitrosoamine, N-ethyl-N-t-butylnitrosoamine, N-isopropyl-N-n-butylnitrosoamine, N-isopropyl-N-t-butylnitrosoamine, N-methyl-N-vinylnitrosoamine, N-ethyl-N-vinylnitrosoamine, N-methyl-N-vinylnitrosoamine, N-t-butyl-N-vinylnitrosoamine, N-n-butyl-N-vinylnitrosoamine, N-methyl-N-allylni- Table 3

| Experiment No. | Class of additive | Amount added (parts) | Storage stability at 50° C. (days) | Exposure time (min) | Depth (Filling up) (μ) |
|---|---|---|---|---|---|
| Example 6 | N-nitrosopropylamine | 0.015 | 8 | 6 | 150 |
| | " | 0.030 | 15 | 10 | 140 |
| Example 7 | N,N'-diethyldinitrosopropylenediamine | 0.007 | 10 | 7 | 150 |
| Example 8 | N-t-butyl-N-nitrosoallylamine | 0.020 | 11 | 8 | 130 |
| Example 9 | N-nitrosodiphenylamine | 0.007 | 10 | 7 | 200 |
| | " | 0.015 | 25 | 9 | 200 |
| Example 10 | 4-nitrosomorpholine | 0.02 | 8 | 6 | 145 |
| Control 4 | methoxyphenol | 0.02 | 5 | 10 | 50 |
| | " | 0.04 | 9 | 23 | 40 |
| Control 5 | 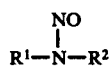 | 0.01 | 5 | 7 | 170 |
| | | 0.05 | | | |
| Control 6 | (methoxyphenol 2,6-di(t-butyl)-p-nitrophenol) | 0.02 0.05 | 6 | 11 | 50 |

What we claim:

1. A light-sensitive composition consisting essentially of
  1. an N-nitroso compound present in from 0.001 to 5 parts by weight per 100 parts by weight of the composition, and having the general formula $$R^1-\underset{\underset{NO}{|}}{N}-R^2$$

wherein $R^1$ and $R^2$, which may be the same or different, are each a member selected from the group consisting of a monovalent hydrocarbon radical, a monovalent hydrocarbon radical attached to the nitrogen atom of amine through -SO$_2$-, and a group of the formula $$-X-\underset{\underset{NO}{|}}{N}-R^3$$

where X is a divalent hydrocarbon radical, and $R^3$ is a monovalent hydrocarbon radical, which may be the same as $R^1$ or different therefrom, and $R^1$ and $R^2$ may trosoamine, N-ethyl-N-allylnitrosoamine, N-isopropyl-N-allylnitrosoamine, N-n-butyl-N-allylnitrosoamine and N-t-butyl-N-allylnitrosoamine.

6. The light-sensitive composition of claim 1 wherein said N-nitroso compound is at least one member selected from the group consisting of N-methyl-N-benzylnitrosoamine, N-ethyl-N-benzylnitrosoamine, N-isobutyl-N-benzylnitrosoamine, N-n-butyl-N-benzylnitrosoamine, N-t-butyl-N-benzylnitrosoamine, dibenzylnitrosoamine, N-ethyl-N-phenylnitrosoamine, N-isopropyl-N-phenylnitrosoamine, N-n-butyl-N-phenylnitrosoamine, N-t-butyl-N-phenylnitrosoamine, diphenylnitrosoamine, N,N'-dimethyldinitroso-p-phenylenediamine, N,N'-diethyldinitroso-p-phenylenediamine, N,N'-diphenyldinitroso-p-phenylenediamine, N,N'-dialkyldinitroso-alkylenediamines, N-alkyl-N'-phenyldinitroso-alkylenediamines, N-alkyl-N'-aralkyldinitrosoalkylenediamines, N,N'-dimethyldinitrosoethylenediamine, N,N'-diethyldinitrosoethylenediamine, N-methyl-N'-phenylnitrosoethylenediamine, N,N'-dimethyldinitrosopropylenediamine, N-methyl-N'-benzylnitrosopropylenediamine, 1-nitrosopiperidine, 1,4-dinitrosopiperazine, 4-nitrosomorpholine and (4,4'-N-nitroso-N-methylamino) N-nitrosodiphenylamine.

7. The light-sensitive composition of claim 6 wherein said photopolymerizable compound is at least one member selected from the group consisting of acrylic acid, methacrylic acid, alpha-ethylacrylic acid, alpha-chloroacrylic acid, methyl acrylate, ethyl acrylate, aluryl acrylate, phenyl acrylate, ethylene glycol diacrylate, polyethylene glycol diacrylate, propylene glycol diacrylate, polypropylene glycol diacrylate, glycerol triacrylate, trimethylolpropane triacrylate, methyl methacrylate, ethyl methacrylate, lauryl methacrylate, ethylene glycol dimethacrylate, polyethylene glycol dimethacrylate, propylene glycol dimethacrylate, polypropylene glycol dimethacrylate, glycerol trimethacrylate, trimethylolpropane trimethacrylate, acrylamide, methacrylamide, alphaethylacrylamide, alpha-chloroacrylamide, diacetoneacrylamide, N-methoxymethylacrylamide, N-butoxymethylacrylamide, N,N'-methylenebisacrylamide, N,N'-hexamethylenebisacrylamide, vinyl acetate, vinyl benzoate, styrene, vinyltoluene, vinylphenol, vinylbenzoic acid, aminostyrene, chlorostyrene, divinylbenzene, allyl acetate, diallyl phthalate and allyl carbonates.

8. The light-sensitive composition of claim 7 which further includes a high molecular weight binder which is compatible with said photopolymerizable compound.

9. The light-sensitive composition of claim 1 wherein $R^1$ and $R^2$, which may be the same or different, are each a member selected from the group consisting of a monovalent hydrocarbon radical and a monovalent hydrocarbon radical attached to the nitrogen atom of amine through $-SO_2-$.

10. The composition of claim 1 wherein the N-nitroso compound is selected from the group consisting of alkyl-aralkylnitrosoamine, alkyl-alkenylnitrosoamine, dialkylnitrosoamine and N-nitroso compound of aromatic amine.

* * * * *